United States Patent [19]

Kinoshita

[11] 4,122,549

[45] Oct. 24, 1978

[54] DYNAMIC RANDOM ACCESS MEMORY HAVING SENSE AMPLIFIER CIRCUITS AND DATA REGENERATION CIRCUIT FOR INCREASED SPEED

[75] Inventor: Hiroyuki Kinoshita, Tokyo, Japan

[73] Assignee: Tokyo Shibaura Electric Company, Limited, Kawasaki, Japan

[21] Appl. No.: 771,792

[22] Filed: Feb. 24, 1977

[30] Foreign Application Priority Data

Feb. 24, 1976 [JP] Japan .................. 51-19178

[51] Int. Cl.$^2$ ............................... G11C 7/00
[52] U.S. Cl. ...................... 365/222; 307/DIG. 3; 307/DIG. 4; 365/205
[58] Field of Search ............... 340/173 FF, 173 CA, 340/173 DR, 173 R; 307/238, DIG. 3, DIG. 4; 365/149, 150, 205, 222, 210

[56] References Cited

U.S. PATENT DOCUMENTS

| | | | |
|---|---|---|---|
| 3,699,539 | 10/1972 | Spence | 340/173 CA |
| 3,810,124 | 5/1974 | Hoffman et al. | 340/173 R |
| 3,940,747 | 2/1976 | Kuo et al. | 340/173 CA |
| 3,949,381 | 4/1976 | Dennard et al. | 340/173 CA |
| 4,000,413 | 12/1976 | Wong et al. | 307/DIG. 3 |
| 4,010,453 | 3/1977 | Lewis | 340/173 FF |
| 4,039,861 | 8/1977 | Heller et al. | 340/173 CA |

OTHER PUBLICATIONS

Heller et al., "High Sensitivity Charge-Transfer Sense Amplifier", IEEE Journal, vol. 5c-11, No. 5, Oct. 1976, pp. 596-601.

*Primary Examiner*—Bernard Konick
*Assistant Examiner*—Donald McElheny
*Attorney, Agent, or Firm*—Oblon, Fisher, Spivak, McClelland & Maier

[57] ABSTRACT

A dynamic Random Access Memory having dummy cells and sense amplifier circuits. The sense amplifier circuits consist of a flip-flop circuit with two nodes and a voltage setting circuit. The potential of the ground terminal of the flip-flop circuits is controlled by the voltage setting circuit, whereby when the magnitude of the read-out voltages of the dummy cell and a selected memory cell are being sensed and amplified by the flip-flop circuit, only the charge of that node at which the read-out voltage is lower is discharged at the ground terminal, and the signal level of that data line in which the voltage is higher is kept unchanged.

A "1" voltage regeneration circuit is connected to the data line for maintaining a more accurate "1" voltage, permitting speeding up of reading out and writing in.

1 Claim, 6 Drawing Figures

DYNAMIC RANDOM ACCESS MEMORY HAVING SENSE AMPLIFIER CIRCUITS AND DATA REGENERATION CIRCUIT FOR INCREASED SPEED

BACKGROUND OF THE INVENTION

1. Field of the Invention

This invention relates to a dynamic RAM (Random Access Memory) with a single transistor storage cell, and more particularly to a sense amplifier circuit used in the dynamic RAM.

2. Description of the Prior Art

Generally, in a RAM utilizing the 1 transistor/cell system, the voltage changes occurring in the data lines are minute, and therefore a "sense amplifier circuit" (output detector) for the evaluation and regeneration of a data, which can detect the read-out data with satisfactory sensitivity and amplify this data reliably is necessary.

Some improvements for the above-mentioned sense amplifier circuit have recently been made, for example see U.S. Pat. No. 3,774,176, issued on Nov. 20, 1973.

In this patent, the sense amplifier circuit is practiced by using a flip-flop circuit having a pair of input nodes, which are connected to data lines. Furthermore a semiconductor switch, for instance a MOS FET, is connected between the nodes operable to place the nodes at the same potential.

In the above-mentioned Dynamic RAM, the sense amplifier circuit can be so designed as to have a sensitivity of 200 to 300 mV, and can be made to perform stabilized reading out and writing in operation, but it has the following defects. Firstly, during amplification of the read-out and during writing in data, direct current flows between the power sources of the sense amplifier circuit, and therefore the power consumed becomes large. Secondly, the above-mentioned sense amplifier circuit operates statically, therefore the conductance of load transistors cannot be made large, and accordingly the speed during amplification of the data becomes slow. Thirdly, when data is being sensed, the voltages of the data lines are reduced to the threshold voltage levels of the switching MOS transistors each of whose gate electrodes are respectively cross-connected to the other transistor's drain electrodes. Furthermore, the stray capacities of the data lines are large (generally diffusion layers are used as the data line in order to make the figure of merit of the memory cells satisfactory), and therefore the voltage change of data line in read-out operation becomes small. Accordingly in order to make the voltage change of the data line large, the capacity of the capacitor of the memory cell was made large, so that there was the defect that the degree of the integration was lowered.

SUMMARY OF THE INVENTION

Accordingly one object of this invention is to provide a dynamic RAM having sense amplifier circuits utilizing a flip-flop circuit whose "sense" sensitivity is very high and power consumption is small.

Another object of this invention is to provide a dynamic RAM having sense amplifier circuits whose operation speed is high.

Yet, another object of this invention is to provide a dynamic RAM having sense amplifier circuits, whereby in case of being practiced as an integrated circuit the integration density is high.

According to this invention, a dynamic Random Access Memory comprises: (a) a sense amplifier circuit consisting of a flip-flop circuit having two nodes and a ground terminal, and a voltage setting circuit for setting the voltage at the ground terminal of the flip-flop circuit, (b) two data lines each respectively connected to one of the nodes of the flip-flop circuit, (c) a first memory cell array connected to one of the data lines and having a plurality of memory cells, (d) a second memory cell array connected to the other data line and having the same number of memory cells as the first memory cell, (e) two dummy cells each respectively connected between the sense amplifier circuit and one of the first and second memory cell arrays, for writing an intermediate potential between the "1" and "0" states into the two nodes of the flip-flop circuit, whereby when data is being read out, the two data lines are charged to the "1" state, and minute voltage changes read out into the data lines from a selected memory cell and a dummy cell are sensed by the flip-flop circuit, after which the voltage at the ground terminal of the flip-flop circuit is gradually discharged to the "0" state.

BRIEF DESCRIPTION OF THE DRAWINGS

A more complete application of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
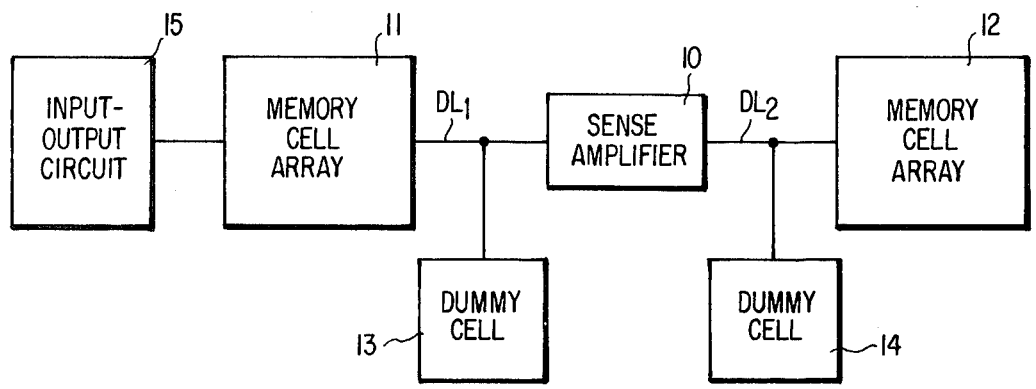
FIG. 1 is a schematic block diagram showing a dynamic RAM having a sense amplifier circuit.

Referring now to the drawings, wherein like reference numerals designate identical or corresponding parts, and more particularly to FIGS. 1 to 3 there will now be described a dynamic RAM according to one embodiment of this invention.

FIG. 1 is a block diagram showing a dynamic RAM in which each memory cell consists of a single insulated gate field effect transistor (designated by the abbreviation "MOS transistor" hereafter) and a single capacitor. Data lines $DL_1$ and $DL_2$ are disposed one on each side of a sense amplifier circuit 10, and memory cell arrays 11 and 12 and dummy cells 13 and 14, respectively, are connected to the data lines $DL_1$ and $DL_2$. The memory cell arrays 11 and 12 each consist of the same number of memory cells, and an input/output circuit 15 for putting data in and sending it out is connected to one of the above-mentioned data lines, the line $DL_1$. Although this is not shown in the drawings, in the case of a 4 K bit dynamic RAM consisting of 64 × 64 memory cells, each row is made up of 64 memory cells and one sense amplifier circuit, and address lines AL are so disposed that each of the data lines $DL_1$ and $DL_2$ connected to nodes at the left and at the right of the sense amplifier circuit 10, is crossed by 32 address lines at right angles to the data line, In the dynamic RAM constructed as described above, the magnitudes of the data on the data lines $DL_1$ and $DL_2$, read out from the selected memory cell in memory cell array 12 and the dummy cell 13 which is on the data line $DL_1$ on the opposite side, are compared by the sense amplifier circuit 10 and, after amplification, read out as data through the input/output circuit 15. Also, the arrangement is such that when data is being read in, the data comes through the input/output circuit 15 and for the memory cell array 11 on the data line $DL_1$ side the data is read in directly, and for the memory cell array 12 on the data line $DL_2$ side it is read in through the sense amplifier circiut 10.

Figure 2:
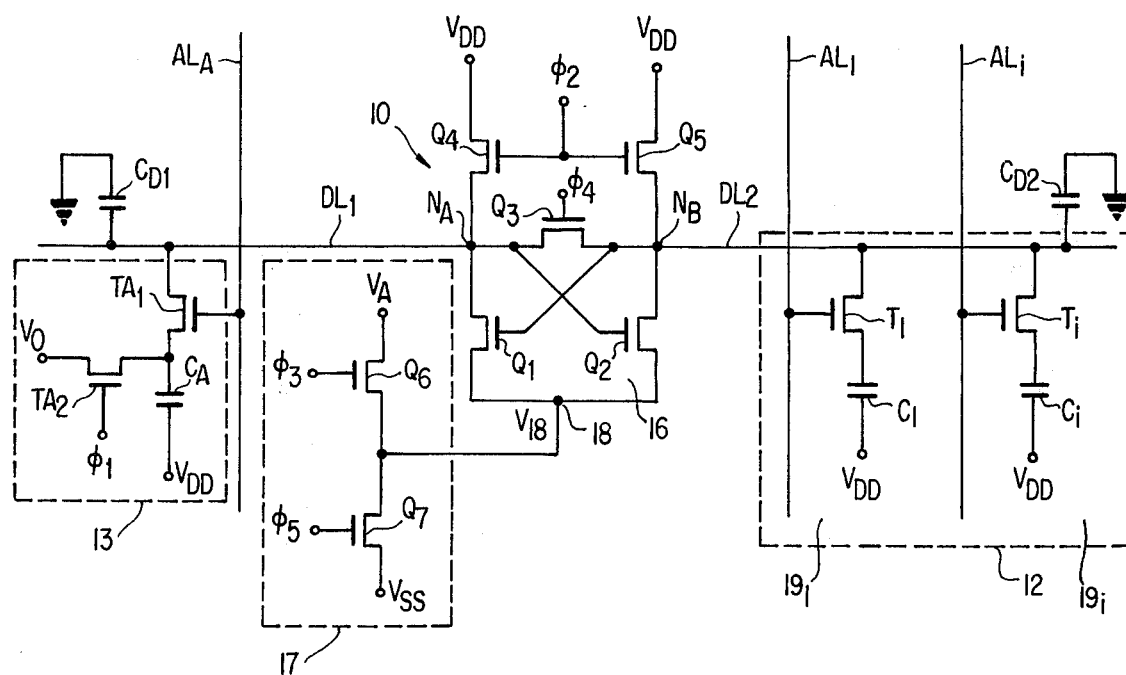
FIG. 2 is a schematic circuit diagram showing one embodiment according to this invention.
Figure 3:
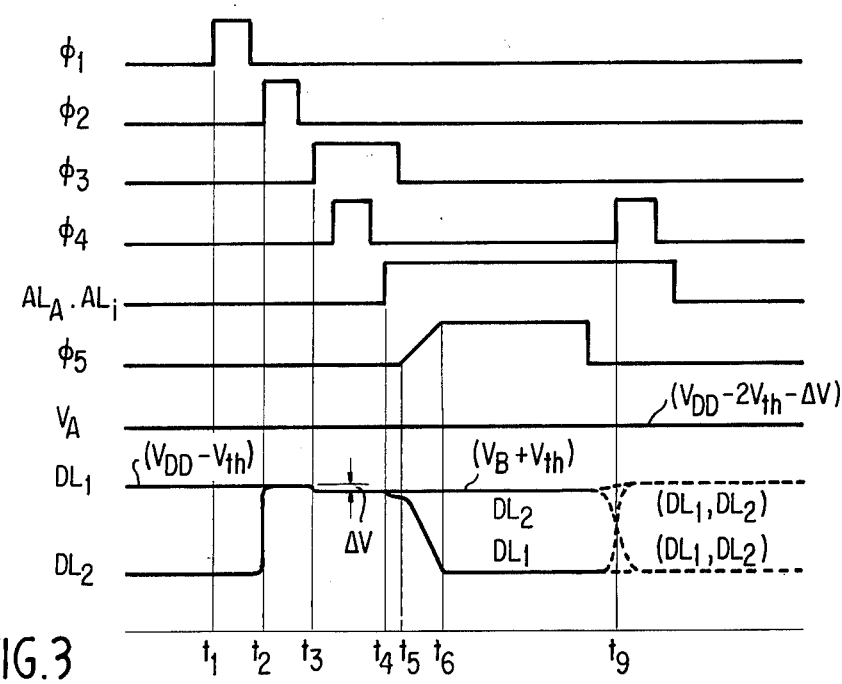
FIG. 3 is a time chart illustrating the operating wave form of the circuit shown in FIG. 2.

The detailed circuit diagram is illustrated in FIG. 2. According to this invention, the potential of the ground terminal $V_{SS}$ of the sense amplifier circuit 10 is controlled, whereby when the magnitudes of the read-out voltages of the dummy cell 13 and the memory cell in the memory cell array 12 are being sensed and amplified by the flip-flop circuit 16 only the charge of that node at which the read-out voltage is lower is discharged at the ground terminal end, and the signal level of that data line in which the voltage is higher is kept unchanged.

Memory cell 19 is a selected one within the memory cell array 12, and consists of a MOS transistor $T_1$, and a capacitor $C_1$, and is selected by an address line $AL_1$. Also, in the dummy cell 13 a MOS transistor $TA_1$ and a capacitor CA are connected to the address line ALA in the same way as in the memory cell, and in addition a MOS transistor $TA_2$ for writing a comparison potential in by applying a control pulse $\phi_1$ to the gate electrode thereof is connected to the connection point of transistor $TA_1$ and capacitor CA. Usually an intermediate potential $V_O$ between "1" and "0" is set as the comparison potential. Sense amplifier circuit 10 consists of a flip-flop circuit 16 and a voltage setting circuit 17.

The flip-flop circuit 16 is so constructed that a connection between the nodes NA and NB is made by the flip-flop circuit 16 consisting of the "cross-coupled" MOS transistors $Q_1$ and $Q_2$, and by the MOS transistor $Q_3$. For this flip-flop circuit 16, a MOS transistor $Q_4$ is provided, between a power source $V_{DD}$ and the node NA, and a MOS transistor $Q_5$ is provided, between the power source $V_{DD}$ and the node NB.

The voltage setting circuit 17 is provided at the ground terminal end 18 of the flip-flop circuit 16 and consists, for instance, of MOS transistors $Q_6$ and $Q_7$. The voltage potential $V_{18}$ at the terminal 18 can be set at the voltage potential of a power source $V_A$ by means of the MOS transistor $Q_6$, and can be set at a ground potential $V_{SS}$ by means of the MOS transistor $Q_7$. That is to say, the MOS transistors $Q_6$ and $Q_7$ are connected in series, the clock $\phi_3$ is supplied to the gate electrode of transistor $Q_6$, the clock $\phi_5$ is supplied to the gate electrode of transistor $Q_7$ and the connection point of these MOS transistors $Q_6$ and $Q_7$ is connected to the terminal 18 of the flip-flop circuit 16. Also, the voltage magnitude of the power source $V_A$ is set at a voltage which is $\Delta V$ smaller than $(V_{DD} - 2V_{th})$, namely at $(V_{DD} - 2V_{th} - \Delta V)$. In this description $V_{th}$ means a threshold of the MOS transistor.

The voltage setting circuit 17 may be connected to each of the sense amplifier circuits provided for the corresponding data lines in other rows, or one common voltage setting circuit may be connected to a plurality of the sense amplifier circuits.

The operation of the circuit of the embodiment shown in FIG. 2 will next be described with reference to the operating wave form shown in FIG. 3. FIG. 3 shows an operating waveform diagram for the case in which the above-mentioned MOS transistors are all constructed as N channel transistors. First of all, by means of the clock $\phi_1$ a voltage $V_o$ intermediate between "0" and "1" is written into the capacitor CA of the dummy cell 13. Next, by means of the clock $\phi_2$ the data lines $DL_1$ and $DL_2$ are charged to "1". At this time, if the "1" voltage of the clock $\phi_2$ is $V_{DD}$ and the threshold voltage of the transistors $Q_4$ and $Q_5$ is $V_{th}$, then at the time $t_2$ the data lines $DL_1$ and $DL_2$ are both charged up to the voltage $(V_{DD} - V_{th})$. At the time $t_3$ the clock $\phi_3$ is supplied to the MOS transistor $Q_6$ of the voltage setting circuit 17, whereupon the voltage $V_{18}$ of the terminal 18 becomes $V_A$, namely $(V_{DD} - 2V_{th} - \Delta V)$. This causes the data lines $DL_1$ and $DL_2$ to be discharged until the difference between the gate voltage and the source voltage of the MOS transistors $Q_1$ and $Q_2$ becomes the threshold voltage $V_{th}$, that is to say, they are discharged from $(V_{DD} - V_{th})$ down to $(V_{18} + V_{th})$. That is to say, the potential of the data lines $DL_1$ and $DL_2$ is reduced by the amount $\Delta V$, so that the sensitivity of the sense amplifier circuit 10 attains its optimum state. In this state, when the clock $\phi_4$ is supplied to the MOS transistor $Q_3$ so the data lines $DL_1$ and $DL_2$ are connected, the effect due to variation of the transistors is eliminated and stable discharge of the data line $DL_1$ and $DL_2$ can take place until their potential is $(V_{18} + V_{th})$. The address lines ALA and $AL_1$ go to "1" at the time $t_4$, whereupon the comparison voltage $V_O$ and the data, respectively, are read out from the dummy cell 13 and the memory cell 19, so that a minute change of voltage occurs in the data lines $DL_1$ and $DL_2$, and a difference in conductance between the transistors $Q_1$ and $Q_2$ is produced, that is to say, the transistor $Q_1$ is rendered conductive and transistor $Q_2$ is rendered nonconductive. Accordingly, in the interval between this and the time $t_5$ the data line having the lower potential, that is to say the data line $DL_1$ on the dummy cell 13 side, gradually discharges whereupon the sensing operation of the data in the memory cell 19 is completed. In this case, if at the same time $t_4$, the voltage $V_{18}$ of the terminal 18 is slightly lowered still further so as to be, for instance, about 0.5 volt below $V_a$, namely $(V_{DD} - 2V_{th} - \Delta V)$, the sensitivity of the sense amplifier circuit 10 increases.

Now, at the time $t_5$ the clock $\phi_5$ gradually goes to "1", whereupon discharge to the $V_{SS}$ end begins at the terminal 18. The data line $DL_2$ in which the read-out voltage is higher is kept at the voltage $(V_{18} + V_{th})$ set by means of the clock $\phi_3$, that is to say at $(V_{DD} - V_{th} - \Delta V)$. The data line $DL_2$ in which the read-out voltage is lower is discharged down to the voltage of $V_{SS}$. Accordingly, amplification of the data is completed. That is to say, the minute change in the read-out voltage becomes clearly defined "0" and "1" voltages which appear on the data lines $DL_1$ and $DL_2$. The voltage $(V_{DD} - V_{th} - \Delta V)$ of the data line $DL_2$ is now written into the capacitor Ci of the memory cell 19 also. Now, if the content of the memory cell 19 is "0", the data line $DL_2$ discharges whereby ground potential $V_{SS}$ is written into the capacitor $C_i$ so that this is "refreshed". But if the timing of the rise of the clock $\phi_5$ is too fast, that is to say, the discharge time of the terminal 18 is too short, then during the refreshing of data "1" the voltage of the data line DL$_2$ is reduced to below the voltage to which it was charged at the outset. Therefore this is undesirable and it is necessary to set the timing of the clock $\phi_5$ reliably. Also, as in the known case, the amplified signal is supplied by way of the data line DL$_1$ to the input output circuit 15, as a signal which is the opposite of the memory content of the memory cell 19.

Next, the write-in cycle will be described referring to FIG. 3.

For writing data in, first of all a decision is made, in the input/output circuit 15 shown in FIG. 1, as to which one of the data lines DL$_1$ and DL$_2$ is to be chosen. If the memory cell array 11 connected to the data line DL$_1$ is selected by means of the address signal which is then sent, then an input signal In is supplied, unchanged, from the input/out circuit 15. If the memory cell array 12 connected to the data line DL$_2$ is selected, then an input signal $\overline{\text{In}}$ is produced by inversion of the input signal In. During writing in, first of all the clock $\phi_5$ is put to "0", and at time $t_9$ the clock $\phi_4$ is raised to "1" so that the data lines DL$_1$ and DL$_2$ are connected, and the signal sent from the input/output circuit 15 is written into the memory cell. If a memory cell connected to the data line DL$_1$ is selected, the data In is written in, and in the case of DL$_2$, $\overline{\text{In}}$ is written in, and by this means the data read out is correctly sent, as the output, from earlier one of the memory cell arrays. Also, the arrangement may be made such that during output the read-out data is inverted according to the selected array.

As described above, in the dynamic RAM of this invention the arrangement is such that when the magnitudes of the read-out voltages of the dummy cell and the memory cell are compared by the sense amplifier circuit, only the data line on the low voltage side is discharged to ground potential V$_{SS}$, and as regards the potential of the data line in which the read-out voltage is high, the voltage set at the outset is kept unchanged. In this case, firstly, no direct current path at all is formed in the sense amplifier circuit, and therefore the power consumed is very greatly reduced. Secondly, as shown in FIG. 2 a read-out voltage of "0" is discharged to V$_{SS}$, and therefore the speed of operation of the sense amplifier circuit is fast. Thirdly, when data is being sensed the data lines are each at the high voltage of "1", and therefore, in cases in which the data lines are formed by diffusion layers the stray capacities of the data lines can be made small because of large expansion of the depletion layer and the change in the read-out voltage can be made large. Thus, as is clear from the embodiment described above, the defects of the known dynamic RAM are all eliminated, the sensitivity of the sense amplifier circuit also becomes satisfactory and the degree of integration of the memory cells can be made higher.

Results obtained experimentally with the dynamic memory apparatus constructed in accordance with the above embodiment are as follows. In a case in which the ratio of the stray capacities $C_D$:($C_{D1} + C_{D2}$) of the data lines and the capacity $C_1$ of the memory cell is $C_D/C_i =$ 10 and the rise voltage of the clock $\phi_5$ is 50 nsec, the sense sensitivity is not above 200mV and the "1" voltage reduction width of the data line during "1" read-out is kept within 10% of the total amplitude (the difference voltage between "0" and "1").

Figure 4:
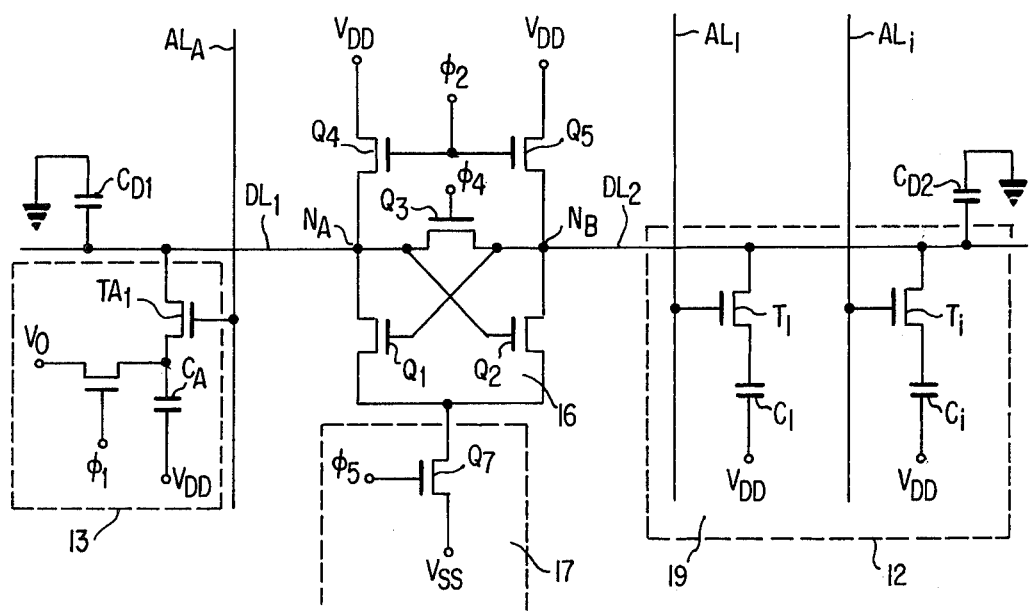
FIG. 4 is a schematic circuit diagram showing another embodiment according to this invention.

FIG. 4 shows a modified example of this invention. The voltage setting circuit 17 consists of one MOS transistor Q$_7$ and the clock $\phi_5$ (which is the same pulse of the clock $\phi_5$ of the embodiment of FIG. 2) is supplied to this transistor Q$_7$. In this case it is desirable that a respective voltage setting circuit 17 should be connected to each one of the sense amplifier circuits. The operating waveform is not shown, but it is the same as that of the previous embodiment shown in FIG. 3, except that the clock $\phi_3$ is omitted. That is to say, the MOS transistor Q$_6$ is removed so that the circuit structure is simplified, and by means of the clock $\phi_2$ or $\phi_4$ the potential differences between the voltages of the nodes N$_A$ and N$_B$ and the terminal 18 are set equal to the threshold voltages of the MOS transistors Q$_1$ and Q$_2$.

Figure 5:
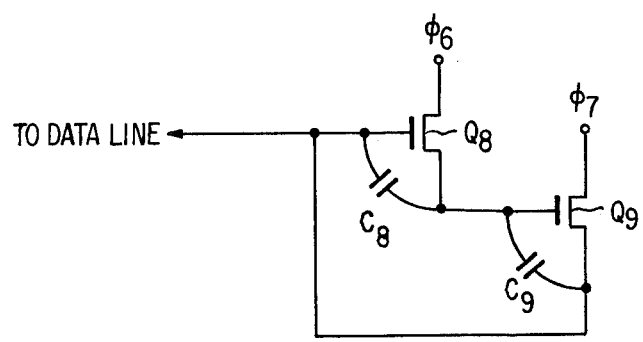
FIG. 5 is a schematic circuit diagram showing a "1" voltage regeneration circuit which is used in this invention.

FIG. 5 shows a "1" voltage regeneration circuit which is connected to the data line. This circuit consists of two MOS transistors Q$_8$ and Q$_9$ and two capacitors C$_8$ and C$_9$ respectively connected between the gate electrodes and source electrodes of transistors Q$_8$ and Q$_9$, and clocks $\phi_6$ and $\phi_7$ are respectively supplied to the drain electrodes of the transistors Q$_8$ and Q$_9$.

Figure 6:
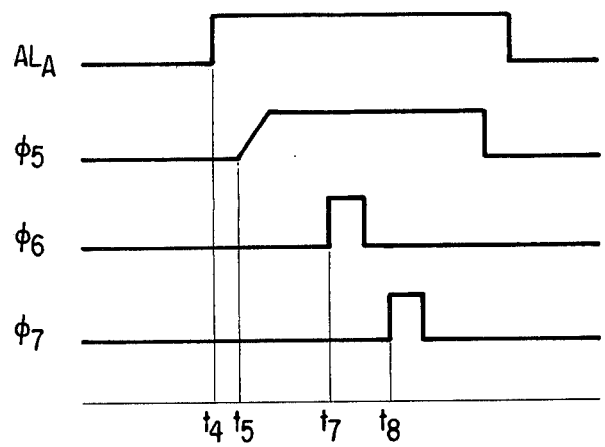
FIG. 6 is a time chart illustrating the operating wave form of the "1" voltage regeneration circuit shown in FIG. 5.

The operating waveform of the "1" voltage regeneration circuit is shown in FIG. 6. Only when the data of the regenerated data line is at the "1" state, the clocks $\phi_6$ and $\phi_7$ are supplied in succession at the time $t_7$ and $t_8$, so that the transistors Q$_8$ and Q$_9$ carry out a bootstrap operation and a clearly defined "1" voltage is thus regenerated.

By means of the above-mentioned circuit, the "1" voltage is made more accurate. Accordingly, the rise of the clock $\phi_5$ applied to the voltage setting circuit can be made faster, thus permitting speed up of writing in and reading out. Furthermore, the capacity of the memory cell can be made smaller, so that still higher integration can be achieved.

When this invention particularly described above is used, the sense amplifier circuit is made to operate dynamically so that a highly sensitive and highly efficient dynamic RAM can be provided.

Although this invention has been disclosed and illustrated with reference to particular applications, the principles involved are susceptible of numerous other applications which will be apparent to those skilled in the art. The invention is, therefore, to be limited only as indicated by the scope of the amended claims.

What is claimed as new and desired to be secured by letters patent of the United States is:

1. A dynamic Random Access Memory comprising:
   a sense amplifier circuit consisting of a flip-flop circuit having two nodes and a ground terminal, and a voltage setting circuit for setting the voltage at the ground terminal of the flip-flop circuit;
   two data lines each respectively connected to one of two nodes of the flip-flop circuit;
   a first memory cell array connected to one of the data lines and having a plurality of memory cells;
   a second memory cell array connected to the other data line and having the same number of memory cells as the first memory cell array;
   two dummy cells each respectively conected between the sense amplifier circuit and one of the first and second memory cell arrays, for writing an intermediate potential between the "1" and "0" states into the two nodes of the flip-flop circuit,
   whereby when data is being read out, the two data lines are charged to the "1" state, and minute voltage changes read out into the data lines from a selected memory cell and a dummy cell are sensed by the flip-flop circuit, after which the voltage at the ground terminal of the flip-flop circuit is gradually discharged to the "0" state, a "1" voltage regeneration circuit connected to one of the data lines and consisting of first and second transistors having source, gate and drain electrodes, and first and second capacitors respectively connected between the gate electrodes and source electrodes of the transistors, the source electrode of the first transistor being connected with the gate electrode of the second transistor, the gate electrode of the first transistor and the source electrode of the second transistor being commonly connected with one of the data lines, and input terminals for supplying various clock pulses to the drain electrodes of the first and second transistors.

* * * * *